(12) United States Patent
Bek

(10) Patent No.: US 6,679,137 B1
(45) Date of Patent: Jan. 20, 2004

(54) ELECTRICAL PLUG-IN CONNECTION FOR AN AUTOMATIC TRANSMISSION OF A MOTOR VEHICLE

(75) Inventor: Manfred Bek, Tettnang (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 78 days.

(21) Appl. No.: 10/129,903

(22) PCT Filed: Nov. 14, 2000

(86) PCT No.: PCT/EP00/11211
§ 371 (c)(1),
(2), (4) Date: May 9, 2002

(87) PCT Pub. No.: WO01/36847
PCT Pub. Date: May 25, 2001

(30) Foreign Application Priority Data

Nov. 18, 1999 (DE) .......................... 199 55 437

(51) Int. Cl.[7] .............................................. F16H 57/02
(52) U.S. Cl. ...................................... 74/606 R; 74/607
(58) Field of Search ...................... 74/606 R, 507; 60/328; 200/61.89, 83, 251; 439/276, 34, 76.2

(56) References Cited

U.S. PATENT DOCUMENTS

| | | | |
|---|---|---|---|
| 4,271,728 A | * | 6/1981 | Wakamatsu .................. 477/34 |
| 4,693,141 A | * | 9/1987 | Iwanaga .................... 74/606 R |
| 5,429,516 A | * | 7/1995 | d'Alayer de Costemore d'Arc .................................. 439/159 |
| 5,480,313 A | * | 1/1996 | d'Alayer de Costemore d'Arc .................................. 439/159 |
| 5,611,372 A |   | 3/1997 | Bauer et al. ................ 137/884 |
| 5,637,007 A | * | 6/1997 | Suzuki et al. ............... 439/276 |
| 5,662,007 A | * | 9/1997 | Starker et al. ............. 74/606 A |
| 5,692,909 A | * | 12/1997 | Gadzinski .................... 439/34 |
| 5,707,243 A | * | 1/1998 | Endo et al. ................. 439/76.2 |
| 5,729,436 A | * | 3/1998 | Yoshigi et al. ............... 361/752 |
| 5,941,137 A |   | 8/1999 | Beer et al. ................. 74/606 R |
| 6,183,290 B1 |  | 2/2001 | Loibl ......................... 439/492 |
| 6,290,537 B1 | * | 9/2001 | Sommer ...................... 439/559 |

FOREIGN PATENT DOCUMENTS

| | | | |
|---|---|---|---|
| DE | 93 07 228.7 | 8/1993 | ........... F16H/57/00 |
| DE | 43 44 584 C2 | 12/1996 | ........... B60R/16/00 |
| DE | 297 21 908 U1 | 3/1998 | ........... H01R/23/72 |
| DE | 195 29 665 C2 | 8/1998 | ........... F16H/61/00 |
| DE | 196 32 820 C2 | 10/1998 | ........... H01R/9/22 |
| DE | 197 51 095 C1 | 5/1999 | ........... H05K/7/02 |
| DE | 199 03 712 A1 | 8/2000 | ........... H01R/13/74 |
| DE | 199 22 819 A1 | 11/2000 | ........... H05K/7/02 |
| EP | 0 758 726 A2 | 2/1997 | ........... F16H/61/28 |

OTHER PUBLICATIONS

Rösche, Rudolf and Gerhard Wagner, "Elektrohydraulische Steuerung und äussere Schaltund des automatischen Getriebes W5A 330/580 von Mercedes–Benz", *ATZ Automobiltechnische Zeitschrift* 97, 1995, pp. 698–706.

* cited by examiner

*Primary Examiner*—Thomas R. Hannon
*Assistant Examiner*—Vicky A. Johnson
(74) *Attorney, Agent, or Firm*—Davis & Bujold, PLLC

(57) ABSTRACT

An electrical plug-in connection for an automatic transmission of a motor vehicle, consisting of a socket (6, 16) and a plug part engaging therein, for transmitting signals required for control of an electrohydraulic control device (10, 20) with the signals received from a signal source situated outside the transmission. The socket (6, 16) is inserted in the oil pan (1, 11) of the transmission and an electrical contact, via a connection (8, 18), automatically results when the oil pan (1, 11) and the transmission housing are assembly and an automatic electric disconnection results when they are disassembled from one another.

6 Claims, 2 Drawing Sheets

ELECTRICAL PLUG-IN CONNECTION FOR AN AUTOMATIC TRANSMISSION OF A MOTOR VEHICLE

FIELD OF THE INVENTION

The invention relates to an electrical plug-in connection for an automatic transmission of a motor vehicle to transmit signals required for control of the hydraulic control device which signals are received from an electronic control device provided outside the transmission.

BACKGROUND OF THE INVENTION

The invention especially relates to the electrical plug-in connection for an electrohydraulic automatic transmission usually consisting of a starting unit such as a hydrodynamic converter, clutches and brakes, a hydraulic control device and an electronic transmission control device. The electronic transmission control device forms, from input variables, the parameters needed for the control of the automatic transmission. Input variables are signals already supplied by sensors and signals made available by other control device such as the motor control device. The electronic transmission control device controls via output signals the electromagnetic actuators located in the hydraulic control device. Shifts are initiated, via said electromagnetic actuators, by selecting an adequate clutch/brake combination. The pressure curve during the shift and the pressure level outside the shift are additionally controlled via the electromagnetic actuators.

The hydraulic control device is often mounted upon the underside of the automatic transmission and comprises a suction snorkel, a valve housing, an intermediate plate with seal and a duct plate, the duct plate and the transmission housing coming to abutment with each other via two faces.

Automatic transmissions for motor vehicles have an electrohydraulic control generally installed horizontally or vertically and containing the electromechanical and electronic parts which are to be connected with a cable harness situated outside the transmission, for example, to supply voltage. DE 43 44 584 describes by way of example a system of magnetic valves, a central plug and a printer board for a hydraulic transmission control device. The electrical lines in the proximity of the electronic module within the transmission are laid out as massive flat lines in the form of a pressed screen or of a flexible printed board. The pressed screens or printed boards are then connected with a socket placed in the transmission housing after which the electrical connection to the vehicle cable harness is created by inserting a mating plug.

Automatic transmissions are already known wherein an electronic transmission control is integrated in the transmission and situated directly on the hydraulic control.

In order to make possible a socket in a horizontal direction in a recess of a perpendicular wall of a transmission housing, it has already been proposed in the Applicant's DE 199 22 819.1 to produce a pressed screen, that is, a two-dimensional arrangement and after insertion in the module carrier, e.g., by an extrusion coating or clamping, to connect it by soldering, welding or riveting with the individual electrical and electronic parts. Thereafter, the socket in a vertical position, that is, with a downwardly directed plug opening, is connected with the pressed screen and after contact has occurred, an end of the pressed screen is bent together with the socket by about 90° depending on the installation position so that the transmission socket comes to a horizontal position. Thereafter, the socket is moved back relative to its final position to the extent that upon vertical insertion of the electrohydraulic control, the socket does not border on the inner wall of the transmission housing. After complete mounting of the -control, the socket is located in prolongation of the installation position behind the port in the transmission housing.

In DE 199 03 712, an electrical plug-in connector to be used with transmission control systems in motor vehicles has already been proposed in order to create an electrical connection between two electrical areas separated from each other by a wall, which comprises a first plug-in connection part that carries electrical plug-in contacts, a second plug-in connection part that contains electric contact bushings and a guide sleeve designed for gripping through an assembly port located in a wall and having the first plug-in connection part at one end and the second plug-connection part at the other end, means being provided for fixing to the wall. The means for connecting the guide sleeve that grips through the wall with the plug-in connection part located behind it can be designed as a kind of thread or a kind of bayonet locking system. The electrical connection between the inaccessible plug-in connection part which is, for example, the plug part provided with a pin housing, and the electrical and/or electronic components situated upon a circuit carrier spaced from the plug-in connection part can be implemented by flexible conductors such as sheet conductors.

In all said electrical plug-in connections known already the socket or plug parts serving as mating plugs are situated in the transmission housing. But in newer transmission such as have now been developed it is no longer possible to assembly one part of the electrical plug-in connection in the transmission housing as a mechatronic solution.

The problem to be solved by this invention is to provide an electrical plug-in connection for the automatic transmission of a motor vehicle where a reliable, safe and automatic connection is made possible despite the disadvantages of modern transmissions determined by installation space.

SUMMARY OF THE INVENTION

It is therefore provided, according to the invention, that the electrical plug-in connection consisting of a transmission socket fixedly situated to the transmission and electrically connected with the electrohydraulic automatic control and of a plug part engaging therein, which is electrically connected with the vehicle cable harness, be configured in a manner such that the socket is inserted in the oil pan of the transmission; when the oil pan and the transmission housing are assembled, an electrical contact occurs and when they are disassembled said electrical contact is disrupted. Via the vehicle cable harness the electrohydraulic transmission control device is supplied, for example, with the vehicle voltage and/or connected with other electronic devices.

In case of an oil pan consisting of plastic material, it is of special advantage that the socket be fixedly connected with the oil pan by injection molding during production.

This firm assembly of the transmission socket (or of the transmission plug) in the oil pan eliminates a subsequent assembly of the plug-in connection in the oil pan which would be extremely unfavorable due to sealing problems or to the narrow installation space. Thereby a tying by a cable harness is also eliminated which is extremely problematic for reasons of cost, and also the oil pan in disassembled state does not adhere to the transmission plug, as would be the case were a cable harness used.

BRIEF DESCRIPTION OF THE DRAWINGS

The invention will now be described, by way of example, with reference to the accompanying drawings in which.

DETAILED DESCRIPTION OF THE INVENTION

Figure 1:
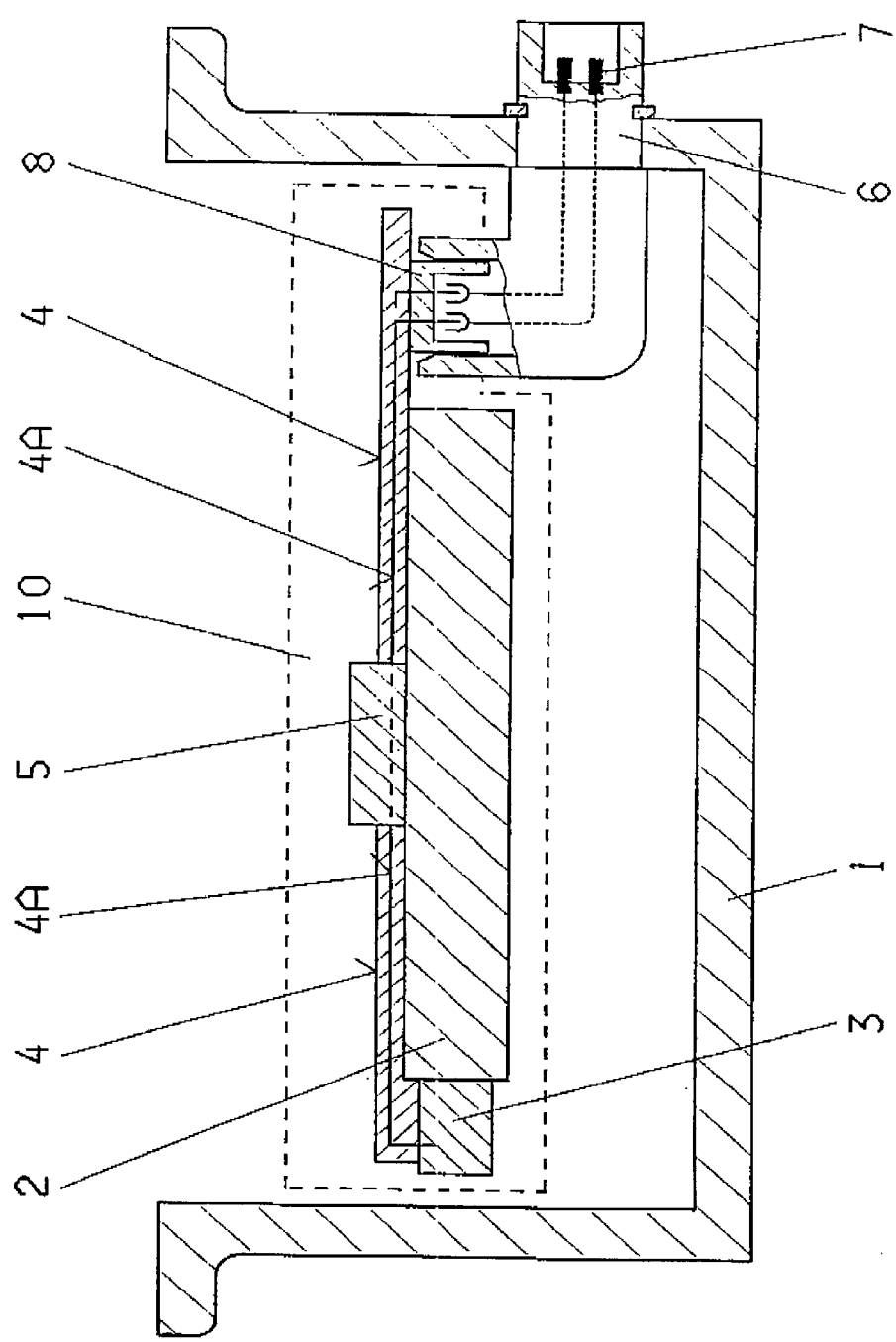
FIG. 1 is a partial section through an automatic transmission with an inventively situated electrical socket.

In the figures only the essential parts for understanding the invention are shown. In the partial section through an automatic transmission for a motor vehicle shown in FIG. 1, the oil pan for the transmission which in this embodiment conventionally consists of metal plate is designated by 1. An electrohydraulic transmission control device is designated by 10 which, in the configuration shown, has a hydraulic automatic control 2, one or more actuators 3 such as pressure regulators or magnetic valves, a conventional printed board or a flexible printed board 4, an electronic automatic control 5 and an electrical connection 8, the latter being provided, for example, on the hydraulic automatic control 5. In another design of the electrohydraulic control 10, it can also be provided that the electronic automatic control 5 is situated in the vehicle outside the transmission.

A socket 6, according to the invention, is now provided in the oil pan 1 as part of an electrical plug-in connection between the electrohydraulic transmission control device 10 or the electronic automatic control 5 and a vehicle cable harness (not shown), with an electrical contact being indicated by 7. The fixed assembly of the socket 6 at an adequate place in the oil pan 1 makes, by way of a connection 8 of the electric conductor, an automatic contact possible during assembly of the oil pan or an automatic detachment of the electrical connection when the oil pan is disassembled.

Figure 2:
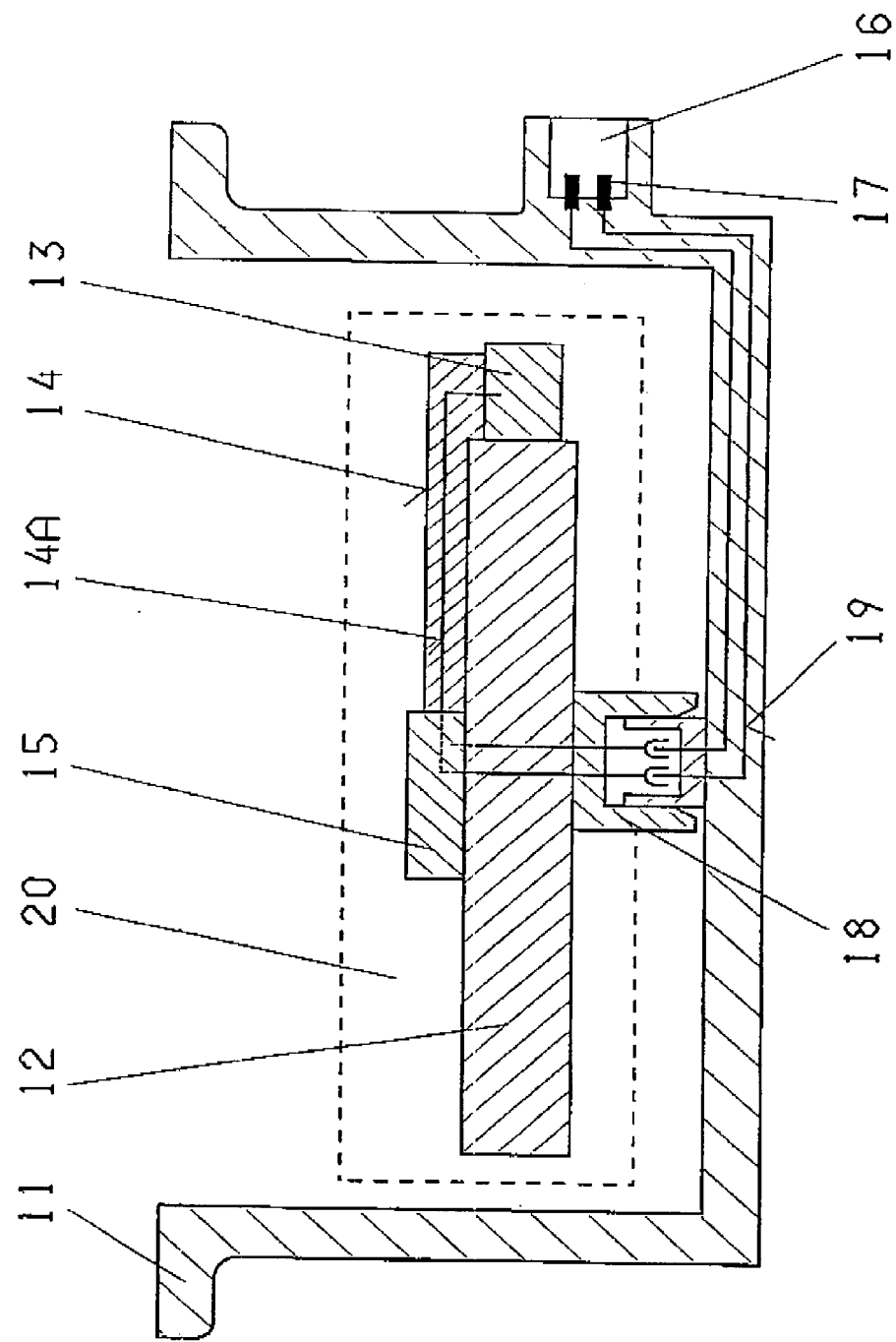
FIG. 2 is a partial section through another automatic transmission likewise with an inventively inserted socket.

In the partial section through an automatic transmission shown in FIG. 2, an oil pan made of a plastic material is designated by 11, again the electrohydraulic automatic control 20 which is a hydraulic control device 12, one or more actuators 13, one pressed screen or one flexible printed board 14 with electrical conductors 14A, one electronic transmission control device 15 and one socket 16 is inventively inserted in the oil pan 11 with an electrical connection 17. In this embodiment, the socket 16 is already advantageously inserted in the oil pan 11 by injection molding during the production process. Again an electrical connection, between the electrical conductor 19 extending from the socket 16 to the hydraulic automatic control 12 and automatically producing the electrical connection when the oil pan 11 is assembled on the transmission, is designated by 18. The electrical conductor 19 can already be integrated in the wall of the oil pan 11 during the production or is situated upon the inner side thereof.

The electrical connection between the electrohydraulic automatic control 20 or the electronic automatic control 15 and the vehicle cable harness (not shown) is created by engagement of a plug part (not shown) of the socket 6 or 16 inserted in the oil pan 1 or 11.

What is claimed is:

1. An automatic transmission for a motor vehicle having an electrical plug-in connection for receiving transmitted signals required for control of an electrohydraulic control device (10, 20) of the automatic transmission, the transmitted signals being received from signal sources situated outside the automatic transmission and conveyed to the electrohydraulic control device (10, 20);

wherein the electrical plug-in connection comprises a socket (6, 16) with a first portion of said socket (6, 16) electrically connectable with said signal sources situated outside the automatic transmission and a second portion of said socket (6, 16) electrically connectable with the electrohydraulic control device (10, 20), the socket (6, 16) is fixedly secured to the automatic transmission such that when said oil pan (1, 11) is assembled with the transmission housing of the automatic transmission, an automatic electrical connection occurs between the second portion of the socket (6, 16) and the electrohydraulic control device (10, 20), and when the oil pan (1, 11) is disassembled from the transmission housing, an automatic electrical disconnection occurs between the second portion of the socket (6, 16) and the electrohydraulic control device (10, 20).

2. The automatic transmission according to claim 1, wherein the oil pan (11) comprises of a plastic material, and said socket (16) is fixedly connected with the oil pan by injection molding during production of the oil pan.

3. The automatic transmission according to claim 1, wherein the electrohydraulic transmission control device comprises a hydraulic automatic control, at least one actuator, a circuit board, an electronic automatic control and an electrical connection for engagement with the second portion of the socket (6, 16).

4. The automatic transmission according to claim 3, wherein the at least one actuator comprises at least one pressure regulator.

5. The automatic transmission according to claim 3, wherein the at least one actuator comprises at least one magnetic valve.

6. The automatic transmission according to claim 3, wherein the circuit board comprises one of a conventional printed board and a flexible printed circuit board.

* * * * *